United States Patent [19]
Meyerhoff

[11] 3,992,674
[45] Nov. 16, 1976

[54] BALANCED DUAL OUTPUT MIXER CIRCUIT

[75] Inventor: Jerry David Meyerhoff, Buffalo Grove, Ill.

[73] Assignee: Motorola, Inc., Schaumburg, Ill.

[22] Filed: Nov. 6, 1975

[21] Appl. No.: 629,332

[52] U.S. Cl. .............................. 329/163; 325/487; 329/204; 329/166; 329/167
[51] Int. Cl.[2] .......................................... H03D 1/10
[58] Field of Search ........... 329/135, 163, 164, 166, 329/167, 204; 325/378, 385, 487

[56] References Cited
UNITED STATES PATENTS
2,881,312  4/1959  Ressler ............................... 329/204

*Primary Examiner*—John Kominski
*Attorney, Agent, or Firm*—James W. Gillman; Phillip H. Melamed

[57] ABSTRACT

An improved balanced dual output diode mixer circuit having separate output terminals for audio and RF output signals is disclosed. The mixer circuit includes a first transformer having a primary and a center tapped secondary winding. The ends of the secondary winding are coupled to end terminals of two separate secondary windings of a second transformer through a switching circuit which comprises four diodes. RF bypass capacitors are coupled between an RF terminal and end terminals of the secondary windings of the second transformer and provide a low RF and a high audio impedance therebetween. RF chokes are coupled between audio output terminals and the RF bypass capacitors and provide a low impedance audio path which is connected at a point of low RF impedance. A pair of resistors coupled between ground and the RF bypass capacitors provide a DC current path to ground for the rectified DC current created by the switching network. The primary winding of the second transformer is coupled to RF output terminals. The balanced dual output diode mixer is adaptable for providing both audio and RF output signals when RF signals are applied directly to the primary winding of the first transformer and through the RF bypass capacitors to the secondary windings of the second transformer.

13 Claims, 1 Drawing Figure

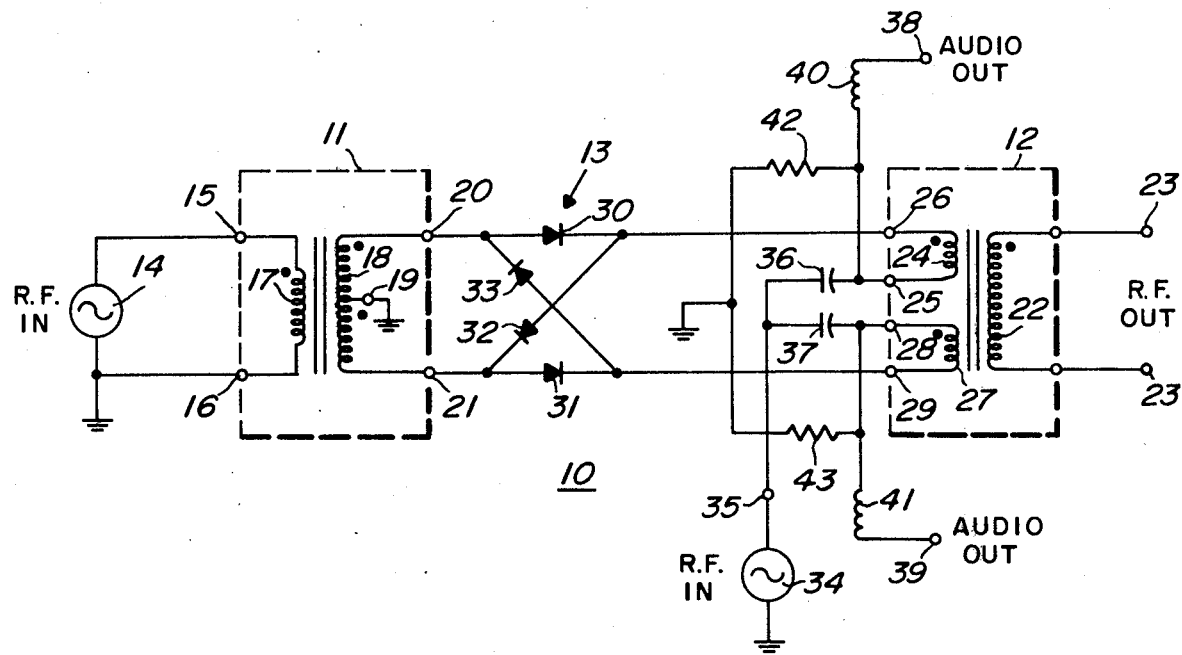

3,992,674

BALANCED DUAL OUTPUT MIXER CIRCUIT

BACKGROUND OF THE INVENTION

The invention relates generally to the field of balanced mixer circuits and more particularly to balanced dual output diode mixer circuits adaptable for mixing two RF (radio frequency) input signals and producing audio or RF output signals.

Balanced mixer circuits, also commonly referred to as ring modulator circuits, generally comprise two transformers each having a center tapped secondary winding, and a diode or other switching type network coupled between the end terminals of the center tapped windings. Typically, a first RF singal is used to excite the primary winding of one transformer and a second RF excitation signal is coupled to the center tap of one of the secondary windings of the transformers. The diode switching network produces a non-linear periodic passing and blocking of signals between the transformers. This results in output signals, having frequencies equal to the sum and difference of the two RF excitation signal frequencies, being obtainable from the primary winding of the second transformer. Such balanced mixers are known and used to produce RF output signals which are substantially isolated from both of the two RF excitation signals.

These prior art balanced mixers have the substantial disadvantage of not being able to produce both an RF output difference signal and an audio output difference signal since available transformers cannot perform satisfactorily at both of these frequency ranges. Thus in many applications, such as in a single sideband radio, these prior balanced mixers cannot be used, without extensively switching input and output connections, to produce both the detected audio signals from the receiver IF (intermediate frequency) signals while also being used to produce a transmitted RF signal by mixing a modulated IF signal with a local oscillator signal.

Some prior art single sideband radios have modified the basic balanced diode mixer and produced a marginally effective mixer which is capable of producing both RF and audio output signals without switching the input and output connections. These dual output balanced mixers use RF bypass (audio blocking) capacitors in series with the signals coupled between the two transformers, and then use RF chokes to tap off the audio frequencies blocked by these capacitors. These prior art circuits connect the RF chokes at points of high RF impedance. The RF chokes therefore degrade the performance of the mixer and high quality RF chokes are required to minimize loading effects. In addition, the capacitors block the rectified DC created by the switching network and thus inherently disturb the operation of the switching network. The net effect is a degradation of the isolation between the two RF excitation signals and the resultant RF and audio output signals as well as an increase in the magnitude of the spurious signals produced by these type of balanced mixers. Also, the operation of the switching network is substantially disturbed.

Thus prior art balanced diode mixers have not been able to provide both RF and audio output signals without reducing the isolation between the RF input and output signals, creating excessive levels of spurious products which cannot be filtered out, or using complex and costly input and output terminal switching networks.

SUMMARY OF THE INVENTION

An object of the present invention is to provide an improved balanced dual output mixer circuit which overcomes all of the aforementioned deficiencies.

A more particular object of the invention is to provide an improved balanced dual output diode mixer circuit adaptable for mixing two input RF signals and producing substantially isolated audio or RF output signals.

In one embodiment of the present invention there is provdided an improved balanced dual output mixer circuit adaptable for mixing two input RF signals and producing audio or RF output signals. The circuit includes: first, second and third RF signal terminals, a reference terminal, and an audio signal terminal, the first and second terminals adaptable for receiving RF input signals; a first circuit means coupled to the first RF terminal for receiving RF signals therefrom and providing substantially equal and opposite polarity RF signals with respect to the reference terminal at two end terminals, these equal signals having the same frequency as the received signals; second circuit means having first and second coil windings, each with first and second end terminals, and a negative combiner means coupled to the third RF terminal for producing RF output signals at the third terminal related to the negative combination of the signals present at the second end terminals; capacitive coupling means for RF coupling signals from the second RF terminal to the first end terminals of the first and second coil windings; RF choke means for audio frequency coupling the audio terminal to one of the first end terminals of the first and second coil windings; and third circuit means coupled to the end terminals of the first circuit means and the second end terminals of the first and second coil windings of the second circuit means for creating signals at said second end terminals having the sum and difference frequencies of the signals present at these terminals.

Basically, the improved mixer circuit uses RF bypass and audio blocking capacitors to trap the audio signal, and RF chokes to tap off this trapped audio signal at points of low RF impedance. By introducing the RF chokes at points of low RF impedance, the effect of these chokes on circuit performance is minimized. Resistors to ground are effectively connected in parallel with these capacitors and provide a DC current path for any rectified DC current produced by the third circuit means. This minimizes the effect of the audio blocking capacitors on the operation of the third circuit means.

BRIEF DESCRIPTION OF THE DRAWING

For a more complete understanding of the invention reference should be made to the drawing, in which a schematic diagram of an improved balanced dual output diode mixer circuit is illustrated.

DESCRIPTION OF THE PREFERRED EMBODIMENT

Referring to the drawing, an improved balanced dual output diode mixer circuit 10 is illustrated as basically comprising a first RF transformer 11 and a second RF transformer 12 (both shown dashed) coupled together by a diode switching network generally indicated by the reference number 13. Two signal generators (14 and 34) are shown in the drawing merely to aid in illustrating a typical mode of operation of the mixer circuit 10 and are not part of the mixer circuit.

The RF signal generator 14 is shown coupled to end terminals 15 and 16 of a primary winding 17 of the first transformer 11. The terminal 16 is also directly connected to ground which represents an RF reference terminal. A secondary winding 18 of the transformer 11 has a center tapped terminal 19 connected to ground and end terminals 20 and 21.

The transformer 12 has a primary winding 22 with end terminals coupled to RF output terminals 23, a first secondary winding 24 having a first end terminal 25 and a second end terminal 26, and a second secondary winding 27 having a first end terminal 28 and a second end terminal 29.

The switching network 13 couples the end terminals 20 and 21 to the end terminals 26 and 29 for alternately passing and blocking signals between these end terminals. This alternate passing and blocking of signals creates new signals having the sum and difference frequencies of the signals present at these terminals. The switching network 13 is a balanced four diode bridge circuit comprising a diode 30 having its anode coupled to terminal 20 and its cathode coupled to terminal 26, a diode 31 having its anode coupled to terminal 21 and its cathode coupled to terminal 29, a diode 32 having its anode coupled to terminal 26 and its cathode coupled to terminal 21, and a diode 33 having its anode coupled to terminal 29 and its cathode coupled to terminal 20. Thus the diodes are arranged such that the terminals 20 and 21 are coupled to each other through two opposite polarity paths, each path comprising two diodes coupled in series with aiding polarities. A first path of one polarity is formed by diodes 30 and 32 and a second path of an opposite polarity is formed by diodes 31 and 33.

An RF signal generator 34 is connected between ground and an RF input terminal 35 which is coupled to terminal 25 through an RF bypass capacitor 36 and to terminal 28 through an RF bypass capacitor 37. These capacitors are short circuits for RF signals but block audio and DC signals. The audio signals present at the terminals 25 and 28 are coupled to audio output terminals 38 and 39 through RF chokes 40 and 41, respectively. The terminals 25 and 28 are connected to ground through resistors 42 and 43, respectively, which form a resistive network to provide a DC current path to ground for the rectified DC signals at the terminals 25 and 28 created by the switching network 13.

The operation of the dual output diode mixer 10 will now be explained with specific reference to its use in both the receive and transmit circuitry of a single sideband radio (not shown). When the radio is in a receiving mode, the RF generator 34 represents the modualated IF frequency signals produced by receiver circuitry in the radio and the RF generator 14 represents a local oscillator having a frequency equal to the IF frequency. Both of these generators are assumed to have low RF output impedances, such as 50 ohms. With the radio in its receiving mode, the primary winding 17 induces signals having the IF frequency into the secondary winding 18. Thus corresponding RF signals having substantially equal magnitudes but opposite polarities with respect to terminal 19 are created at end terminals 20 and 21.

The bypass capacitors 36 and 37 couple the modulated IF frequency signals of the generator 34 through the secondary windings 24 and 27 to the switching network 13. The switching network 13 effectively nonlinearly cross couples these signals and develops opposite polarity signals at the terminals 26 and 29 which have frequencies equal to the sum and difference of the frequencies of the signals produced by the generators 14 and 34. The audio frequency signals present at these terminals are prevented from being shunted to ground through generator 34 by the RF bypass and DC blocking capacitors 36 and 37 which have typical capacitance values of 0.01 microfarads. The resistors 42 and 43 are typically 270 ohms and therefore do not substantially load these audio signals. Thus the RF chokes 40 and 41 provide the only low impedance path available for the audio signals at the terminals 26 and 29 and therefore audio signals are obtainable from either or both of the audio terminals 38 and 39.

When the radio is operative in its transmit mode, the generator 34 once again represents an IF carrier frequency signal having a desired audio modulation frequency signal superimposed upon it. The generator 14 now represents a transmit local oscillator which produces a signal at a frequency equal to the sum of the IF frequency produced by the generator 34 and the desired RF transmit frequency which will be produced at the output terminals 23. In a typical embodiment of the present invention the transmit frequency is 5 MHz, the IF frequency is 10 MHz, and the local oscillator frequency is 15 MHz. The switching action of the network 13 again creates opposite polarity signals at the terminals 26 and 29 having the sum and difference frequencies of the signals produced by the generators 14 and 34. These sum and difference signals flow through the secondary windings 24 and 27 to RF ground (through capacitors 36 and 37 and through generator 34) and create corresponding sum and difference frequency signals at the terminals 23 in a manner which is well known in the art. The primary winding 22 effectively acts as a negative combiner circuit and produces RF output signals at terminals 23 which are a negative combination of the signals present at terminals 26 and 29. This negative combiner effect is primarily responsible for the isolation between the signals produced by the generators 14 and 34 and the difference signals created at the terminals 23.

The balanced configuration of the circuit 10 results in the suppression of the local oscillator signals from the generator 14 at the RF output terminals 23 and the suppression of the modulated IF signals at the output terminals 23. The presence of the RF chokes 40 and 41 does not effect the RF performance of the mixer circuit 10 since these chokes are connected at points of low RF impedance. This is because the terminals 25 and 28 are connected to RF ground through the bypass capacitors 36 and 37 and the output impedance of the generator 34.

Prior dual output balanced mixers connected the RF chokes at points corresponding to the terminals 26 and 29 and thereby degraded the performance of the mixer since a high RF impedance exists between these terminals and ground. In addition, prior art mixers did not provide any DC current path around the blocking capacitors and thereby disrupted operation of the switching network. The configuration of the present invention overcomes these deficiencies of the prior art circuit while still suppressing the IF and local oscillator frequencies with respect to the RF output terminals.

While I have shown and described specific embodiments of this invention, further modifications and improvements will occur to those skilled in the art. Once such modification would be the coupling of the terminal 35 directly to ground and the connection of the generator 34 to the center tapped terminal 19 of the first transformer. All such modifications which retain the basic underlying principles disclosed and claimed herein are within the scope of this invention.

I claim:
1. An improved balanced dual output mixer circuit adaptable for mixing two input RF signals and producing audio or RF output signals, including:
   first, second and third RF signal terminals, a reference terminal, and an audio signal terminal, said first and second terminals adaptable for receiving RF input signals,
   first circuit means coupled to said first RF terminal for receiving RF signals therefrom and providing substantially equal and opposite polarity RF signals with respect to said reference terminal at two end terminals, said equal signals having the same frequency as said received signals;
   second circuit means having first and second coil windings, each with first and second end terminals, and a negative combiner means coupled to said third RF terminal for producing RF output signals at said third RF terminal related to the negative combination of the signals present at said second end terminals;
   capacitive coupling means for RF coupling signals from said second RF terminal to said first end terminals of said first and second coil windings;
   RF choke means for audio frequency coupling said auido terminal to one of said first end terminals of said first and second coil windings; and
   third circuit means coupled to said end terminals of the first circuit means and said second end terminals of the first and second coil windings of said second circuit means for creating signals at said second end terminals having the sum and difference frequencies of the signals present at these terminals.

2. An improved balanced dual output mixer circuit according to claim 1 which includes resistive means coupled between said reference terminal and said first end terminals of the first and second coil windings for providing a DC current path from these terminals to said reference terminal.

3. An improved balanced dual output mixer circuit according to claim 1 wherein said second circuit means comprises a transformer, said first and second coil windings comprise secondary windings of said transformer and said negative combiner means comprises a primary winding of said transformer.

4. An improved balanced dual output mixer circuit according to claim 1 wherein said first circuit means also includes circuitry for providing DC paths between the end terminals of said first circuit means and said reference terminal.

5. An improved balanced dual output mixer circuit adaptable for mixing two input RF signals and producing audio or RF output signals, including:
   first, second and third RF signal terminals, a reference terminal, and an audio signal terminal, said first and second terminals adaptable for receiving RF input signals,
   a first RF transformer having a primary winding coupled to said first RF terminal and adaptable for receiving an RF signal therefrom, said first transformer having a center tapped secondary winding having end terminals and having a center tap terminal coupled to one of said reference and second RF terminals;
   a second RF transformer having a primary winding coupled to said third RF terminal and having first and second secondary windings, each with first and second end terminals;
   capacitive coupling means for RF coupling the other of said reference and second RF terminals to said first end terminals of said first and second secondary windings;
   RF choke means for audio frequency coupling said audio terminal to one of said first end terminals of said first and second secondary windings; and
   circuit means coupled to said end terminals of the secondary winding of said first transformer and said second end terminals of the first and second secondary windings of said second transformer for creating signals at said second end terminals having the sum and difference frequencies of the signals present at these terminals.

6. An improved balanced dual output mixer circuit according to claim 5 which includes resistive means coupled between said reference terminal and said first end terminals of said first and second windings of said second transformer for providing a DC current path from these terminals to said reference terminal.

7. An improved balanced dual output mixer circuit according to claim 5 wherein said capacitive coupling means comprises first and second capacitors coupled from said second RF terminal to said first end terminals of said first and second secondary windings of said transformer, respectively.

8. An improved balanced dual output mixer circuit according to claim 5 wherein said center tap terminal of the first transformer is coupled to ground and said second RF terminal is coupled to said first end terminals of said first and second secondary windings by said capacitive coupling means.

9. An improved balanced dual output mixer circuit according to claim 5 wherein said circuit means includes a balanced four diode bridge circuit with each second end terminal of said first and second secondary windings of said second transformer being coupled to each of said end terminals of said secondary winding of said first transformer through a diode, said diodes arranged such that one of said end terminals of said secondary winding of said first transformer is coupled to the other through two opposite polarity paths, each path comprising two of said diodes coupled in series with aiding polarities.

10. An improved balanced dual output mixer circuit according to claim 9 wherein said capacitive coupling means comprises first and second capacitors coupled from said second RF terminal to said second end terminals of said first and second secondary windings of said second transformer, respectively.

11. An improved balanced dual output mixer circuit according to claim 10 which includes first and second resistors coupled from said reference terminal to said second end terminals of said first and second secondary windings of said second transformer, respectively.

12. An improved balanced dual output mixer circuit adaptable for mixing two input RF signals and producing audio or RF output signals, including:
   first, second and third RF signal terminals, a reference terminal, and an audio signal terminal, said first and second terminals adaptable for receiving RF input signals, a first RF transformer having a primary winding coupled to said first RF terminal and adaptable for receiving an RF signal therefrom, said first transformer having a center tapped secondary winding having end terminals and having a center tap terminal coupled to one of said reference and second RF terminals;

a second RF transformer having a primary winding coupled to said third RF terminal and having first and second secondary windings, each with first and second end terminals;

capacitive coupling means for RF coupling the other of said reference and second RF terminals to said first end terminals of said first and second secondary windings;

RF choke means for audio frequency coupling said audio terminal to one of said first end terminals of said first and second secondary windings; and switching means coupled to said end terminals of the secondary winding of said first transformer and said second end terminals of the first and second secondary windings of said second transformer for alternately passing and blocking signals between the end terminals of said secondary winding of the first transformer and said second end terminals of said first and second secondary windings of the second transformer.

13. An improved balanced dual output mixer circuit adaptable for mixing two input RF signals and producing audio or RF output signals, including:

first, second and third RF signal terminals, a reference terminal, and an audio signal terminal, said first and second terminals adaptable for receiving RF input signals, first circuit means coupled to said first RF terminal for receiving RF signals therefrom and providing substantially equal and opposite polarity RF signals with respect to said second RF terminal at two end terminals, said equal signals having the same frequency as said received signals;

second circuit means having first and second coil windings, each with the first and second end terminals, and a negative combiner means coupled to said third RF terminal for producing RF output signals at said third RF terminal related to the negative combination of the signals present at said second end terminals;

capacitive coupling means for RF coupling said reference terminal to said first end terminals of said first and second coil windings;

RF choke means for audio frequency coupling said audio terminal to one of said first end terminals of said first and second secondary windings; and third circuit means coupled to said end terminals of the first circuit means and said second end terminals of the first and second coil windings of said second circuit means for creating signals at said second end terminals having the sum and difference frequencies of the signals present at these terminals.

* * * * *

UNITED STATES PATENT AND TRADEMARK OFFICE
CERTIFICATE OF CORRECTION

PATENT NO. : 3,992,674
DATED : November 16, 1976
INVENTOR(S) : Jerry D. Meyerhoff It is certified that error appears in the above—identified patent and that said Letters Patent are hereby corrected as shown below:

Claim 10, column 6, line 56, immediately prior to the word "end", delete the word "second" and insert the word --first--.

Claim 11, column 6, line 62, immediately prior to the word "end", delete the word "second" and insert the word --first--.

Signed and Sealed this

Eighth Day of March 1977

[SEAL]

Attest:

RUTH C. MASON
*Attesting Officer*

C. MARSHALL DANN
*Commissioner of Patents and Trademarks*